United States Patent
Tanaka et al.

(10) Patent No.: US 7,400,282 B2
(45) Date of Patent: Jul. 15, 2008

(54) QUANTUM TURING MACHINE

(75) Inventors: Yasumoto Tanaka, Tsukuba (JP); Akira Iyo, Tsukuba (JP); Norio Terada, Tsukuba (JP); Shiro Kawabata, Tsukuba (JP); Athinarayan Sundaresan, Tsukuba (JP); Naoto Kikuchi, Tsukuba (JP); Tsuneo Watanabe, Koganei (JP); Kazuyasu Tokiwa, Tokyo (JP)

(73) Assignees: National Institute of Advanced Industrial Science and Technology, Tokyo (JP); Japan Science and Technology Agency, Kawaguchi-shi (JP); Tokyo University of Science, Tokyo (JP)

( * ) Notice: Subject to any disclaimer, the term of this patent is extended or adjusted under 35 U.S.C. 154(b) by 0 days.

(21) Appl. No.: 10/571,127

(22) PCT Filed: Sep. 2, 2004

(86) PCT No.: PCT/JP2004/013093

§ 371 (c)(1),
(2), (4) Date: Jan. 16, 2007

(87) PCT Pub. No.: WO2005/027234

PCT Pub. Date: Mar. 24, 2005

(65) Prior Publication Data

US 2007/0120727 A1 May 31, 2007

(30) Foreign Application Priority Data

Sep. 9, 2003 (JP) ............................. 2003-316252

(51) Int. Cl.
*H03M 1/00* (2006.01)

(52) U.S. Cl. ............................. 341/133; 327/31; 327/34
(58) Field of Classification Search .................. 341/133; 327/31, 34
See application file for complete search history.

(56) References Cited

U.S. PATENT DOCUMENTS 6,670,630 B2 * 12/2003 Blais et al. ..................... 257/33
6,885,325 B2 * 4/2005 Omelyanchouk et al. ... 341/133

(Continued)

FOREIGN PATENT DOCUMENTS

| JP | 2000-068495 | 3/2000 |
| JP | 2003-209301 | 7/2003 |

OTHER PUBLICATIONS

Amin, M.H.S et al, "Multi-terminal superconducting phase qubit", Physica C., vol. 368, pp. 310-314, 2002.

(Continued)

*Primary Examiner*—Khai M Nguyen
(74) *Attorney, Agent, or Firm*—Oblon, Spivak, McClelland, Maier & Neustadt, P.C.

(57) ABSTRACT

A quantum Turing machine constituted using a quantum bit created by localizing a phase difference soliton S between superconducting electrons existing in each of multiple of bands in a ring R0 that includes a ring main body R1 formed of a superconductor, and well-shaped portions W1, W2 formed with a reduced line-width at at least two positions on the ring main body R1, can easily constitute a quantum bit, can surely execute a basic logical operation, has multiple-bit capability and, moreover, can ensure sufficient time for executing a quantum algorithm.

9 Claims, 14 Drawing Sheets

U.S. PATENT DOCUMENTS 7,042,004 B2 * 5/2006 Magnus et al. ............... 257/31
2005/0107262 A1 * 5/2005 Tanaka et al. ............... 505/474

OTHER PUBLICATIONS

Berman, G.P. et al, "Solid-state quantum computation—a new direction for nanotechnology", Superlattices and Microstructures, vol. 27, No. 2/3, pp. 89-104, 2000.

Gershenfeld, Neil A. et al, "Bulk Spin-Resonance Quantum Computation", Science, vol. 275, pp. 350-356, Jan. 17, 1997.

Nishino, Tetsuro, "Quantum Computer and Quantum Encryption", Iwanami's Lecture Series, "World of Physics", Mar. 15, 2002. (with English translation).

* cited by examiner

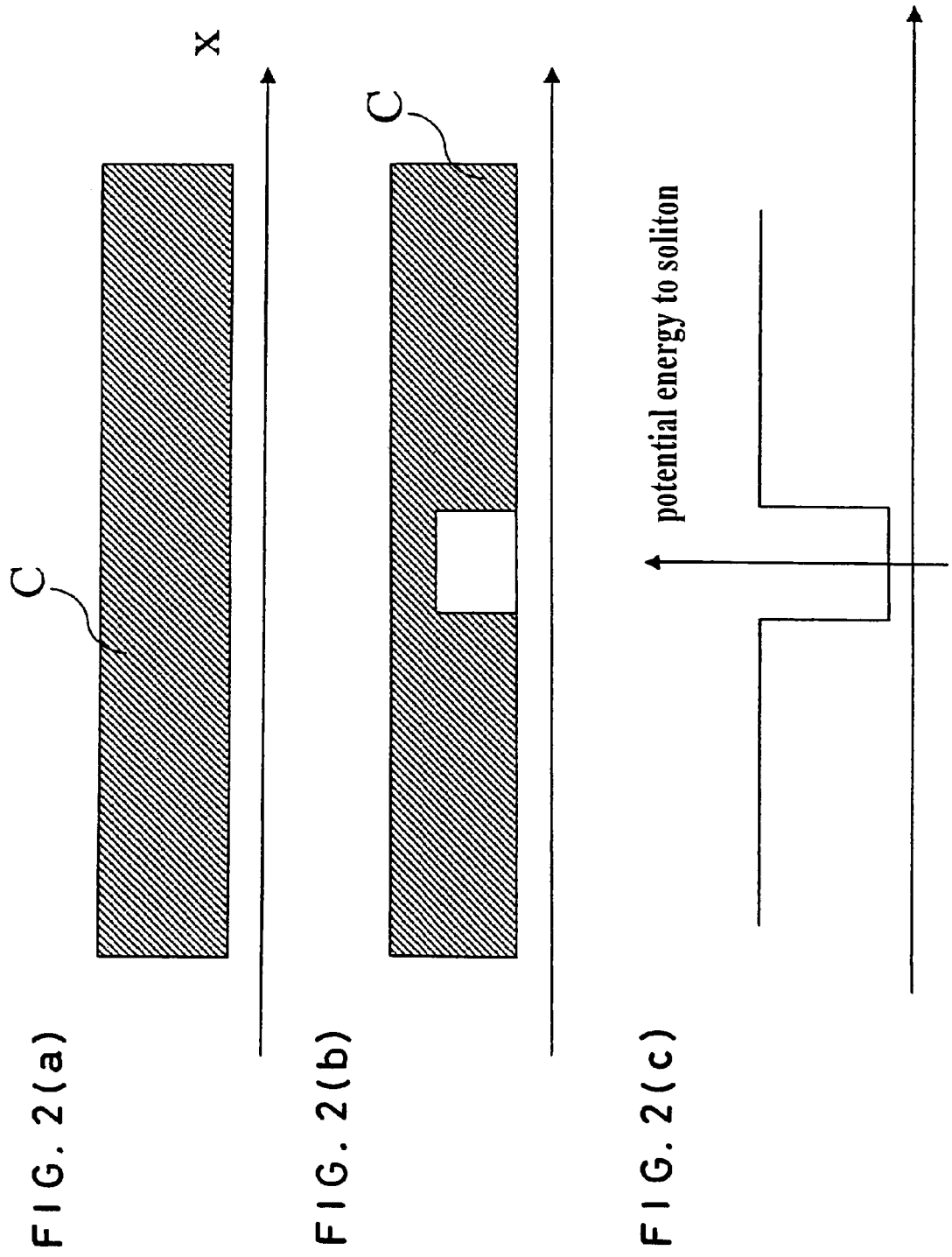

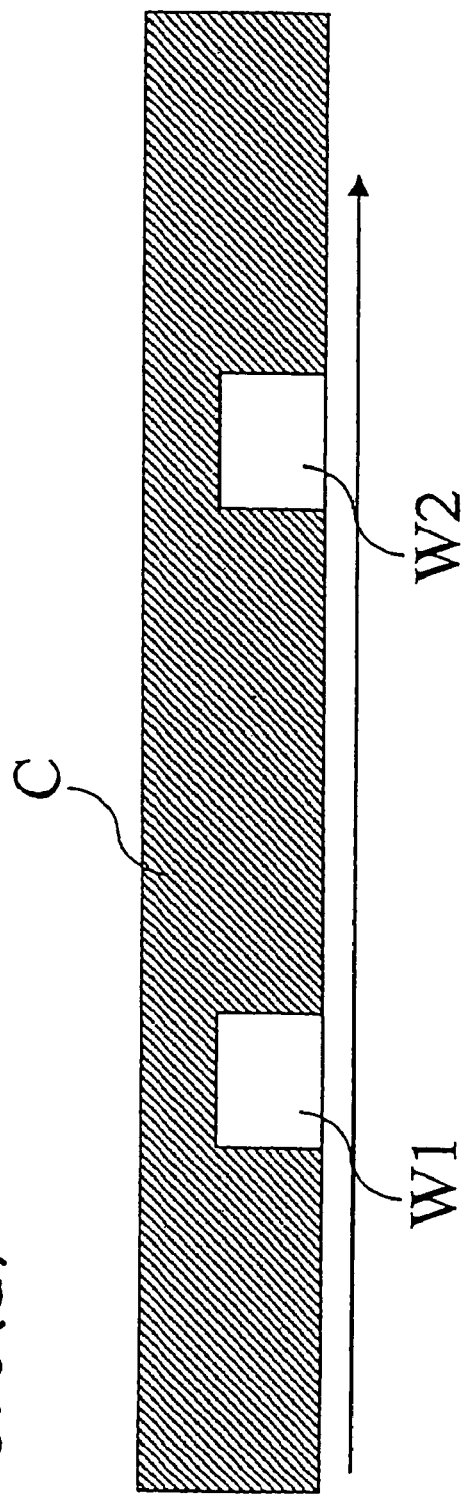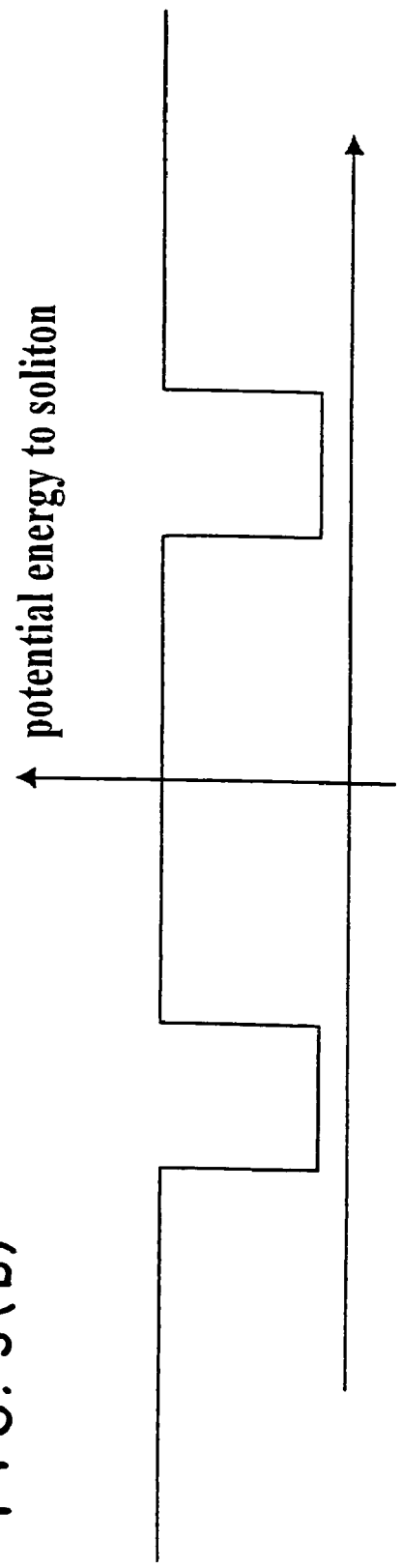
FIG. 3(a)
FIG. 3(b)

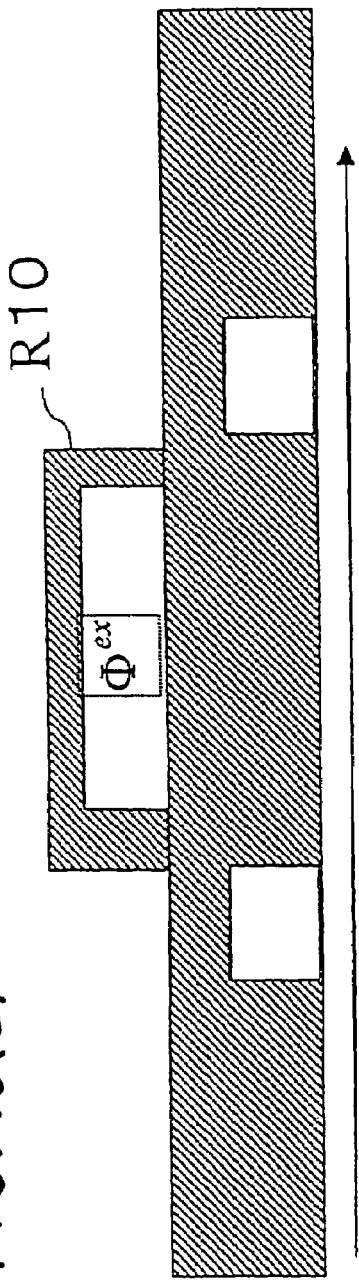
F I G. 13(a)
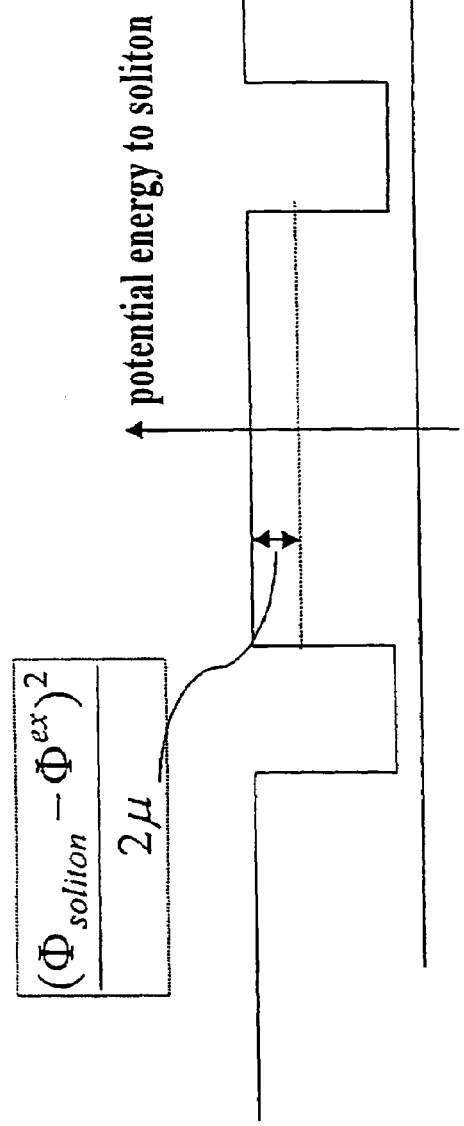
F I G. 13(b)

QUANTUM TURING MACHINE

TECHNICAL FIELD

The present invention relates to a quantum Turing machine formed using a superconductor.

BACKGROUND ART

As a technique of applying the phase difference between multiple superconducting order parameters to electronics, with respect to superconducting electronics that utilize phase difference solitons created between plural types of superconducting electrons, there is the disclosure of Patent Document 1 (Japanese Patent Application Publication 2003-209301) that precedes the present invention.

On the other hand, in quantum Turing machines, various quantum bits have been devised. Methods that use nuclear spin, and methods that use the energy levels of atoms are representative of these. There have also been attempts to create artificial atoms using semiconductors. Quantum bits based on ordinary superconductors have also been proposed.

In the superconducting electronics disclosed in the above Patent Document, the phase difference soliton S between bands that constitutes an information bit has been difficult to manipulate because of its ubiquity in connected circuits. To facilitate bit manipulation, it has to be confined in a spatially small region.

The above Patent Document also provided a method of constituting quantum bits by producing a state in which quanta are superimposed. However, a basic computation method that uses this quantum bit to constitute a quantum Turing machine has not been provided.

With respect to quantum bits that have been proposed up until the present for producing a quantum Turing machine, whatever the proposed method, multiple-bit implementation is difficult with current technology, and it is considered that practical application will take 100 years or more.

Also, with quantum bits that do not use a macroscopic quantum state such as a superconducting state, a superimposed state for making a quantum Turing machine function is easily broken down by interaction with the environment, making it impossible to obtain enough time to use the quantum Turing machine to execute a quantum algorithm.

SUMMARY OF THE INVENTION

This invention was devised in view of the above, and has as its object to provide a quantum Turing machine that can easily constitute a quantum bit and surely execute a basic logical operation, and has multiple-bit capability and, moreover, can ensure sufficient time for executing a quantum algorithm.

To attain the above object, the present invention comprises a quantum Turing machine formed using a superconductor, and is constituted by a quantum bit created by utilizing phase differences between superconducting order parameters existing at each of multiple bands of the superconductor.

The utilization of phase differences between the superconducting order parameters also includes utilization of a phase difference soliton created between plural types of superconducting electrons.

In addition to the invention constituted as described above, the above quantum bit is a quantum bit localizing a phase difference soliton in a line circuit that includes a line circuit main body formed of the superconductor and well-shaped portions formed with a reduced line-width at at least two positions on the line circuit main body.

The above quantum bit is a quantum bit localizing a phase difference soliton in a ring that includes a ring main body formed of the superconductor and well-shaped portions formed with a reduced line-width at at least two positions on the ring main body.

The above quantum bit is a quantum bit constituted by affixing a first auxiliary ring a first well-shaped portion of above the double well-shaped portions has on a portion thereof to the ring, by affixing a second auxiliary ring the second well-shaped portion has on a portion thereof to the ring, and by also providing a switch on each of the rings, the first auxiliary ring and the second auxiliary ring.

The present invention also includes achieving realizing unitary transformation of a quantum bit by localizing a phase difference soliton in the ring and operating each switch of the first auxiliary ring and the second auxiliary ring.

The present invention also includes performing the unitary transformation of the quantum bit by first, within the ring, creating a phase difference soliton in the ring by switching on the switch of that ring while applying a magnetic field corresponding to phase slip produced by a phase difference soliton, next, switching on the switch of an auxiliary ring selected from one of the first and second auxiliary rings, applying a magnetic flux as an external field inside the selected auxiliary ring, switching off the switch of the selected auxiliary ring, and switching it on again after a prescribed time has elapsed.

The present invention includes constituting a control NOT gate between two of the quantum bits by arranging the above quantum bits in two parallel lines, superimposing a balance ring equipped with a switch on a first auxiliary ring of the quantum bit on one side, and also superimposing an interaction ring equipped with a switch across both a second auxiliary ring of the quantum bit on one side and a second auxiliary ring of the quantum bit on the other side.

The present invention also includes executing operation of the control NOT between the above two quantum bits by, first, creating a phase difference soliton within each ring of the two quantum bits by switching on the switch of that ring while applying a magnetic field corresponding to phase slip produced by a phase difference soliton, and after that, switching on the interaction ring switch.

The present invention also includes an arbitrary number of the above quantum bits for multiple-bit implementation.

The present invention also localizes the above phase difference soliton with a probability of either 0% or 100% and performing classic digital logic that does not use a superimposed state.

The present invention also includes a quantum Turing machine formed using a superconductor, constituted by a quantum bit created by utilizing plural types of superconducting order parameters existing in a same band of the above superconductor.

By devising the configuration of the electric wire of superconduction, a superconducting soliton S having multiple superconducting order parameters can be localized, bit manipulation becomes easy, and quantum bits easily consist of quantum Turing machines of this invention. Also, basic logical operation can be surely executed. Also, multiple-bit and integration are possible. Furthermore, using the macroscopic quantum state that is a superconductor makes it easier to maintain coherence and can ensure sufficient time for executing a quantum algorithm.

BRIEF DESCRIPTION OF THE DRAWINGS

FIG. 2 is a diagram showing an example of an electric line shape for soliton localization and the localization principle, in which FIG. 2(a) shows a state in which a soliton moves about unevenly when the electric line has a uniform width, FIG. 2(b) shows a state in which, when the electric line has a narrowed portion, a soliton localizes to that portion, and FIG. 2(c) is a diagram showing conceptually the potential energy with respect to the soliton.

FIG. 3 is a diagram showing a method of constituting a quantum bit based on double-well shaped potentials and a soliton, in which FIG. 3(a) is an explanatory diagram of an electric line predetermined with a well-shaped portions that a soliton enters, and FIG. 3(b) is a diagram showing the potential with respect to the soliton of the electric line of FIG. 3(a).

FIG. 13(a) is a diagram for explaining a mode of modulating the tunneling probability of a soliton constituting a quantum bit using an auxiliary ring.

FIG. 13(b) is a diagram showing conceptually potential energy with respect to the soliton.

BEST MODE FOR CARRYING OUT THE INVENTION

Embodiments of this invention will be described based on the drawings.

In this invention, a quantum Turing machine is constituted by a quantum bit formed utilizing phase differences between superconducting order parameters existing at each of multiple bands of a superconductor. Here, this utilization of phase differences between superconduction order parameters is, for example, utilization of a phase difference soliton S created between plural types of superconducting electrons.

First, a configuration that localizes this phase difference soliton S will be explained. As shown in FIG. 1(a), a ring R formed of a superconductor having multiple bands can be opened and closed by a switch SW. Superconductors having multiple bands include $Cu_xBa_2Ca_3CuO_y$, etc.

Figure 1B:
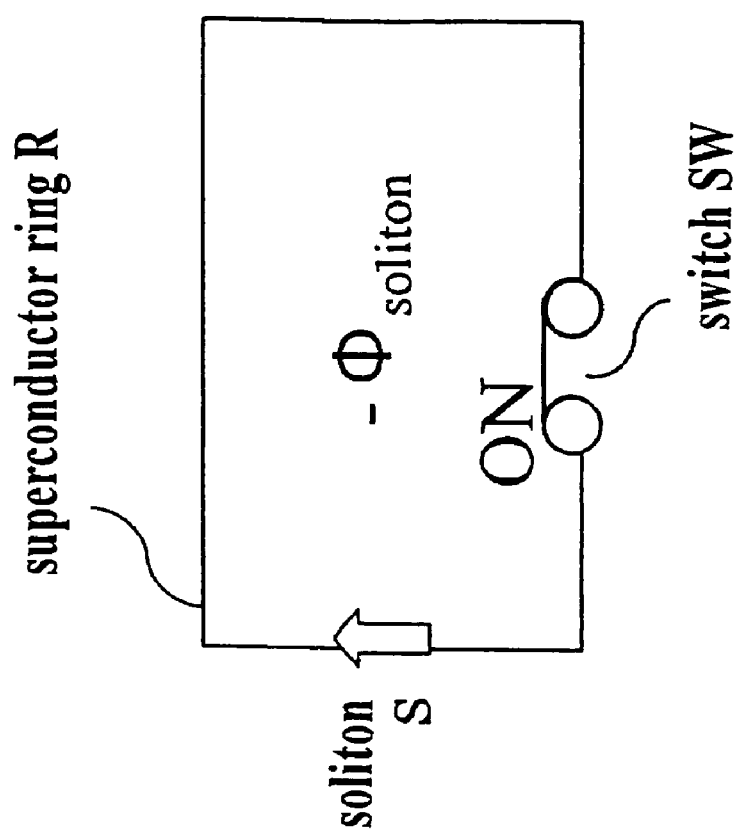
FIG. 1(b) is an explanatory diagram of a state in which a soliton has been created.
Figure 1A:
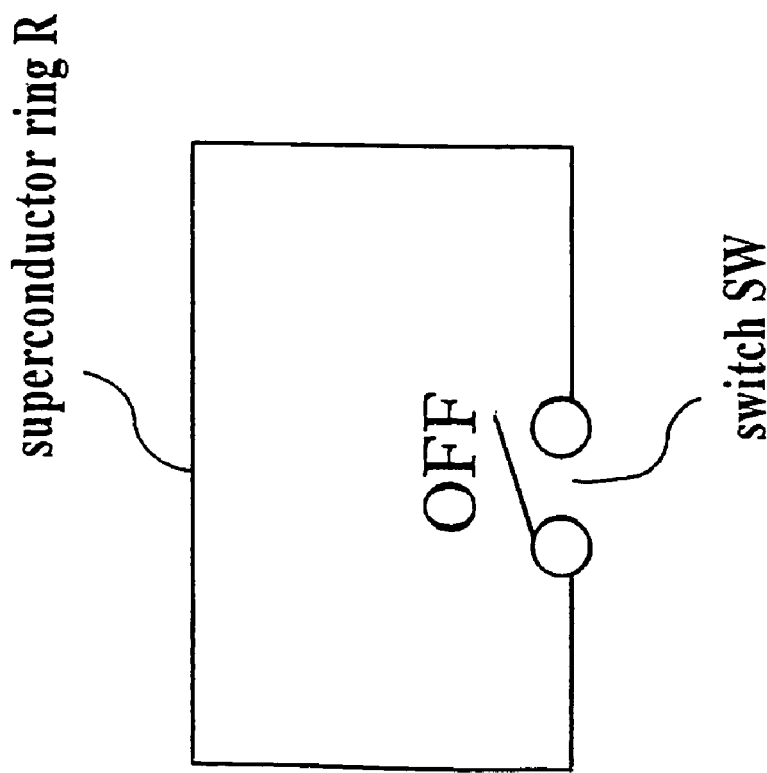
FIG. 1 is an explanatory diagram of a method of creating a soliton in a superconductor, with FIG. 1(a) being an explanatory diagram of a state in which a soliton has not been created.

When switch SW is switched on while applying a magnetic field $\Phi$soliton corresponding to the phase slip $\Theta$soliton based on the phase difference soliton S, soliton S is produced in the ring R (FIG. 1 (b)). Here, soliton S is indicated by an arrow. The direction of the arrow shows the direction of the shift in phase.

The soliton S thus created has the same energy wherever it is in the ring R, so it is ubiquitous in the ring R. The existence probability thereof will comply with a quantum-mechanical probability distribution.

Next, an example of a shape devised for localizing the soliton S is described. In FIG. 1, the circuit (ring) is depicted as an electric line having no thickness, but in fact a superconducting electric line constituting a circuit does have thickness. That electric line is shown conceptually in FIG. 2. Assuming a soliton S were to be placed on the electric line C, in the case of FIG. 2(a) it may be anywhere, so the soliton S is ubiquitous. The energy of the soliton S is proportional to the sectional area of the electric line C, so if a narrow portion is formed in the electric line C, as shown in FIG. 2(b), it will make it easier for the soliton S to drop in there (easier to localize).

In FIG. 2(c) this is conceptually depicted, with the vertical axis being the potential energy sensed by the soliton S, and the horizontal axis being the direction in which the electric line C extends.

In this way, the soliton S can be localized by a process of partial narrowing or the like of the electric line C.

Next, an example of using the soliton S thus localized by the above method to constitute a quantum bit is described.

Figure 4A:
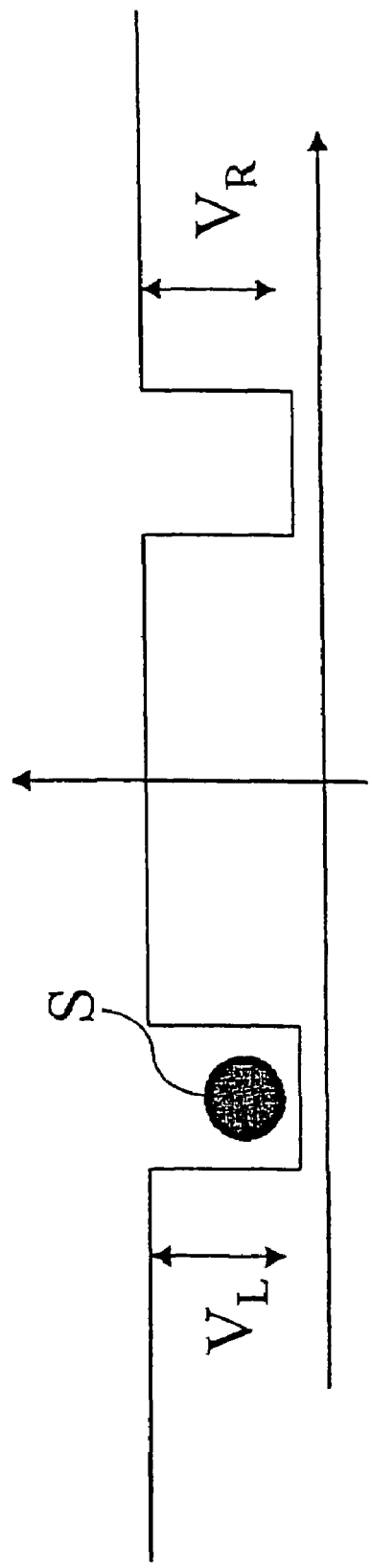
FIG. 4(a) is a diagram showing the state of a soliton in the left well-shaped portion of the electric line of FIG. 3.
Figure 4B:
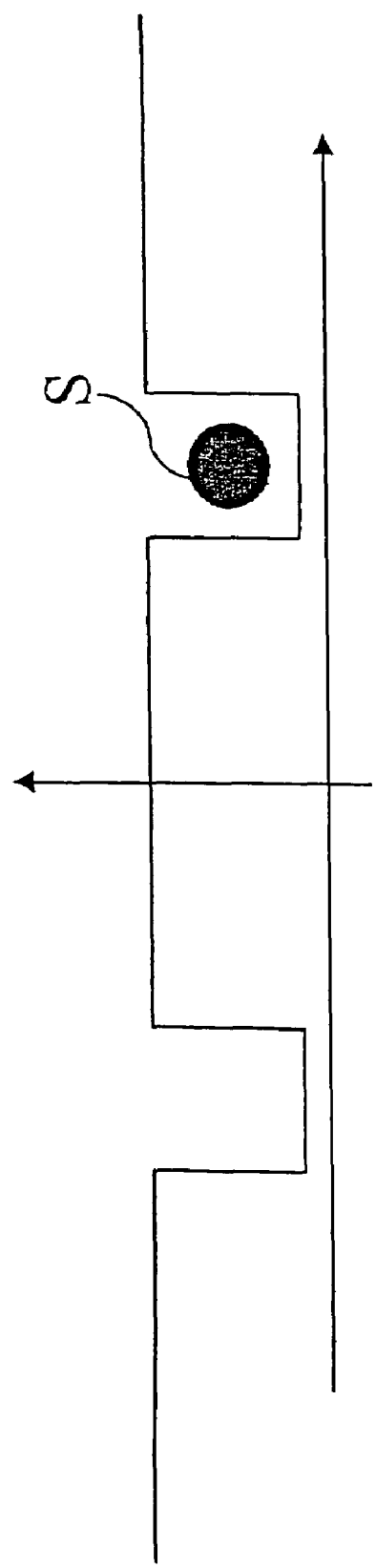
FIG. 4(b) is a diagram showing the state of a soliton in the right well-shaped portion of the electric line of FIG. 3.

Narrowed portions (well-shaped portions) W1, W2 are formed left and right at two positions on the electric line C, as shown in FIG. 3(a). FIG. 3(b) illustrates the potential produced by this electric line C. When one soliton S is inserted here, classically it will enter either the left (left-side well-shaped portion W1) or it will enter the right (right-side well-shaped portion W1). FIG. 4(a) and FIG. 4(b) shows this state. Here, the black circle represents the soliton S. Quantum-mechanically, this problem corresponds to a state in which one particle is inserted into a system having double well-shaped potentials. The soliton S corresponds to a particle. The soliton S can tunnel through the potential barrier. If $a^+_L$ is the creation operator that creates the soliton S on the left and $a_L$ is the annihilation operator, and $a^+_R$ is the creation operator that creates the soliton S on the right and $a_R$ is the annihilation operator, tunneling probability is $T_A$, and the depth of the well-shaped potential is $V_L$, $V_R$ as shown in FIG. 4(a), the Hamiltonian H of this system will be as in Equation (1) below.

[Equation 1]

$$H = V_L a_L^+ a_L + V_R a_R^+ a_R + T_A(a_L^+ a_R + a_R^+ a_L) \quad (1)$$

If one soliton S is inserted into such a Hamiltonian H, it becomes a quantum bit. If the wave function when the soliton S is on the left is $\Psi_L$, and the wave function when on the right is $\Psi_R$, the wave function $\Psi(t)$ of this quantum bit is expressed by the following equation (2).

[Equation 2]

$$\Psi(t) = c_L(t)\psi_L + c_R(t)\psi_R \quad (2)$$

In the above equation (2), $c_L(t)$, $c_R(t)$ are coefficients that change with time, complex numbers that satisfy the following equation (3).

[Equation 3]

$$|c_L(t)|^2 + |c_R(t)|^2 = 1 \quad (3)$$

Incidentally, when a quantum Turing machine is realized using a quantum bit, the qualities required of the quantum bit are the two points (1) An arbitrary unitary transformation can be executed on one quantum bit
(2) A control NOT gate can be constituted by two quantum bits (see Iwanami Lectures, The World of Physics, "Quantum Computers and Quantum Ciphers" by Nishino Tetsuro, published Mar. 15, 2002, ISBN 4-00-011159-0, page 36). A quantum Turing machine satisfying these two points was realized with a quantum bit constituted by the above-described localized soliton S. An example thereof is described below.

First, an example of a method of realizing unitary transformation of one quantum bit is described.

Figure 5B:
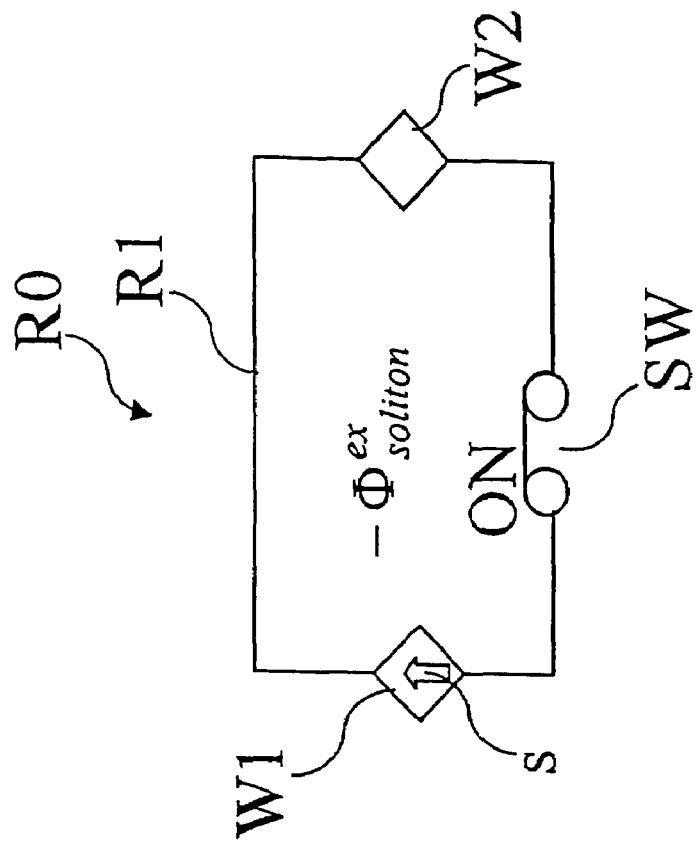
FIG. 5 is an explanatory diagram of the condition that creates a soliton in a superconducting electric line having double well-shaped potentials, with FIG. 5(a) being an explanatory diagram of a state in which a soliton is not created, and FIG. 5(b) being an explanatory diagram of a state in which a soliton is created in the left well-shaped portion.
Figure 5A:
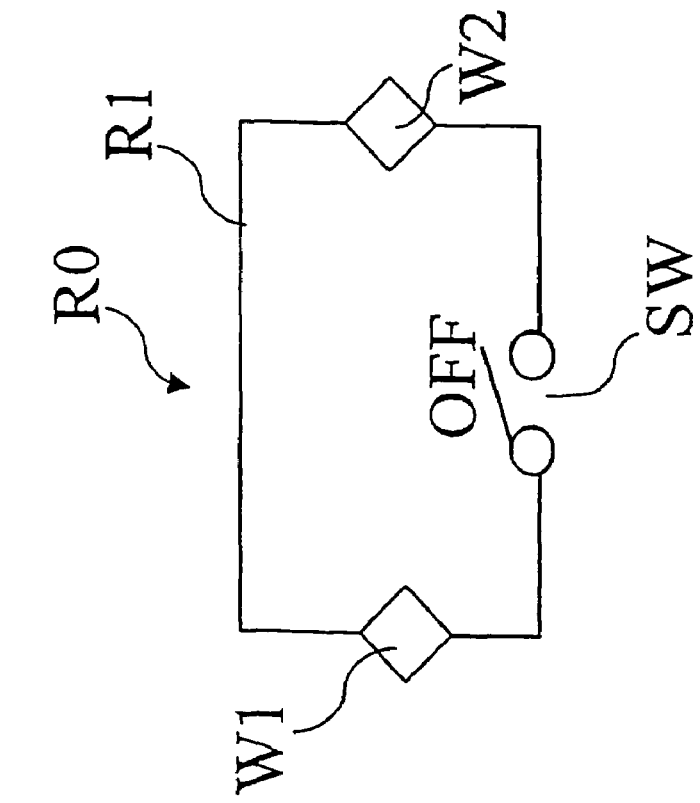

As shown in FIGS. 5(a) and 5(b), a ring R0 was formed of a ring main body R1 formed of a superconductor, a switch SW provided on the ring main body R1, and well-shaped portions W1, W2 formed with a reduced line-width at two positions on the main ring body R1. Then, a soliton S was created on the ring R0 by the same technique as FIG. 1. The soliton S in FIG. 5(b) is created in either of the well-shaped portions W1, W2. Also, an external field is kept applied throughout. At this stage, Hamiltonian H has the same form as in the above equation (1). Also, well-shaped portions W1, W2 are given the same shape. That is to say, $V_L = V_R$. At this time, the eigenfunction $\Psi(t)$ of the Hamiltonian H will be the following equation (4),

[Equation 4]

$$\Psi(t) = c_B(t=0)\chi_B + c_A(t=0)\exp\left(-i\frac{2T_A}{\hbar}t\right)\chi_A \quad (4)$$

where, $\chi_B = (\psi_L + \psi_R)/\sqrt{2}$ $\chi_A = (\psi_L - \psi_R)/\sqrt{2}$ In equation (4), usually directly after switching on (t=0) is $c_A(t=0)=0$.

Figure 6:
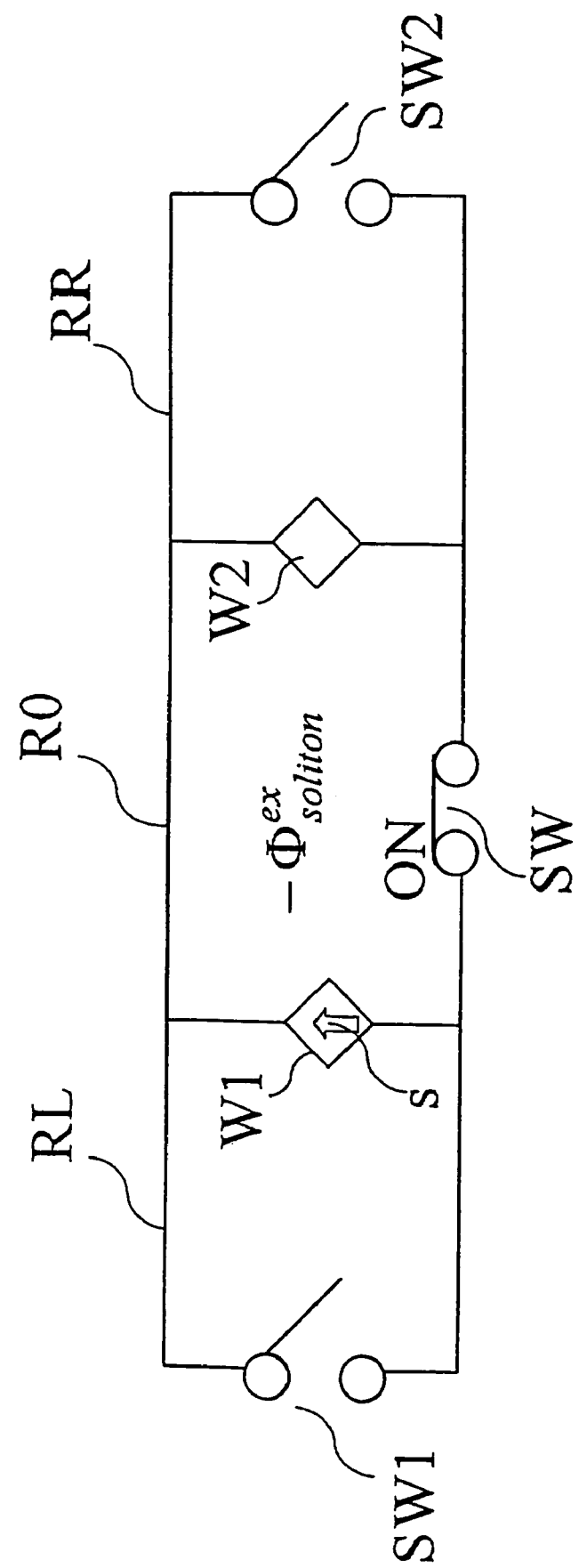
FIG. 6 is a diagram for explaining a mode that enables arbitrary unitary transformation with a quantum bit.

As shown in FIG. 6, a quantum bit is constituted by affixing a first auxiliary ring RL a first well-shaped portion W1 of the above double well-shaped portions W1, W2 of the above ring R0 has on a portion thereof to the ring R0, affixing a second auxiliary ring RR the second well-shaped portion W2 has on a portion thereof to the ring R0, and by also providing a switch SW1, SW2 on each first auxiliary ring RL and second auxiliary ring RR.

Figure 7:
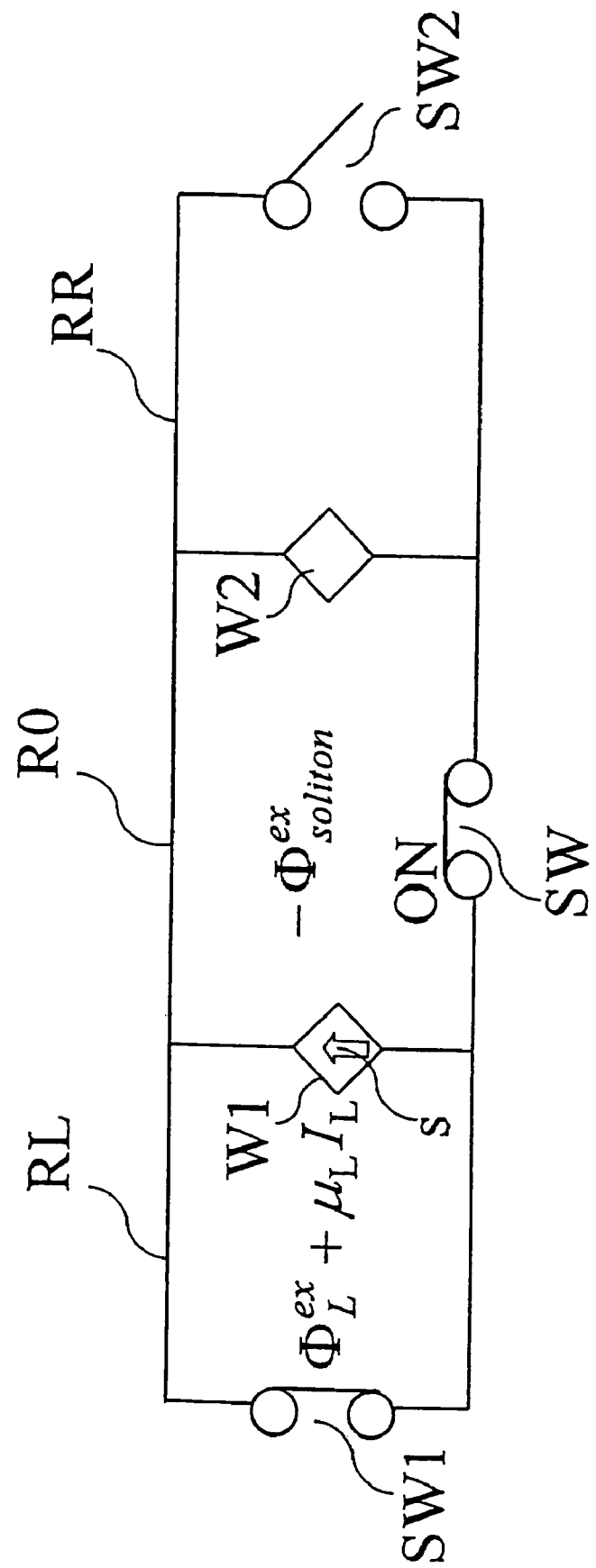
FIG. 7 is a diagram for explaining a mode that enables arbitrary unitary transformation with a quantum bit.

Then, as shown in FIG. 7, the switch SW1 of the first auxiliary ring RL is switched on thereby generating in the first auxiliary ring RL as an external field an amount of magnetic flux that is

[Equation 5]

$\Phi_L^{ex}$

Based on the boundary conditions, when there is a soliton S in the first well-shaped portion W1 of the ring R0, the following equation (6) applies,

[Equation 6]

$\Phi_L^{ex} + \mu_L I_L + \Phi_{soliton} = 0 \quad (6)$ and the following equation (7) applies when there is a soliton S in the second well-shaped portion W2.

[Equation 7]

$\Phi_L^{ex} + \mu_L I_L = 0 \quad (7)$

In the above equations (6) and (7), $\mu L$ is the coefficient of self-induction of the first auxiliary ring RL, $I_L$ is the induced superconducting electric current induced in the first auxiliary ring RL, and $\Phi$soliton is the amount of magnetic flux for compensating for the soliton S based phase slip.

When there is a soliton S, energy rises by

[Equation 8]

$$\frac{1}{2}\mu_L I_L^2 = \frac{1}{2\mu_L}(\Phi_{soliton} + \Phi_L^{ex})^2$$

and when there is no soliton S, energy rises by

[Equation 9]

$$\frac{1}{2}\mu_L I_L^2 = \frac{1}{2\mu_L}(\Phi_L^{ex})^2$$

Here, if

[Equation 10]

$$V_L^{(1)} = \frac{1}{2\mu_L}\left((\Phi_{soliton} + \Phi_L^{ex})^2 - \Phi_L^{ex2}\right)$$

using equation (1), the system Hamiltonian H will be the following.

[Equation 11]

$H = (V_L + V_L^{(1)})a_L^+ a_L + V_R a_R^+ a_R + T_A(a_L^+ a_R + a_R^+ a_L)$

If the following,

[Equation 12]

$|V_L + V_L^{(1)} - V_R| >> |T_A|$ then

[Equation 13]

$\Delta V = V_R - (V_L + V_L^{(1)})$ is maintained, and the system wave function $\Psi(t)$ will take the following form.

[Equation 14]

$$\Psi(t) = c_L(t=t_a)\psi_L + c_R(t=t_a)\exp\left(-i\frac{\Delta V}{\hbar}t\right)\psi - R \quad (14)$$

In the above equation (14), $t_a$ is the time at which the switch SW1 of the first auxiliary ring RL is switched on.

Next, an example will be used to explain how the wave function $\Psi(t)$ evolves over time with the switch SW1 of the first auxiliary ring RL being on or off.

In FIG. 7, the time at which the switch SW of ring R0 is switched on is t=0. When $0<t<t_a$, there is no evolution over time, precisely speaking, the following equation (15) applies, with no phase difference produced in the coefficients $\Psi_L$ and $\Psi_R$.

[Equation 15]

$\Psi(t) = (\psi_L + \psi_R)/\sqrt{2} \quad (15)$

Next, it is assumed that the switch SW1 of the first auxiliary ring RL is switched on at time $t=t_a$. At this time, the evolution over time will be as follows.

[Equation 16]

$$\Psi(t) = \frac{1}{\sqrt{2}}\psi_L + \frac{1}{\sqrt{2}}\exp\left(-1\frac{\Delta V}{\hbar}(t-t_a)\right)\psi_R$$

Switch SW1 of the first auxiliary ring RL is left switched on until

[Equation 17]

$$\frac{\pi}{2} = \frac{\Delta V}{\hbar}(t_b - t_a)$$

time is $t=t_b$. When it becomes this time, it will be

[Equation 18]

$$-i = \exp\left(-i\frac{\Delta V}{\hbar}(t_b - t_a)\right)$$

so switch SW1 is switched off.

Wave function $\Psi(t)$ in $t=t_b$ is expressed by the following equation (19).

[Equation 19]

$$\Psi(t) = \frac{1}{\sqrt{2}}(\psi_L - i\psi_R) \quad (19)$$

After switching SW1 off, evolution over time in $t>t_b$ will again revert to the form of equation (4), and if left at

[Equation 20]

$$\frac{2T_A}{\hbar}(t - t_b) = 2\alpha$$

will become

[Equation 21]

$$\begin{aligned}\Psi(t) &= \frac{1}{2}((1-i)\chi_B + (1+i)\exp(-2i\alpha)\chi_A) \\ &= \frac{1}{2\sqrt{2}}((1-i)(\psi_L + \psi_R) + \\ &\quad (1+i)\exp(-2i\alpha)(\psi_L - \psi_R)) \\ &= \exp(-i\alpha)\left(\cos\left(\frac{\pi}{4} + \alpha\right)\psi_L + \sin\left(\frac{\pi}{4} + \alpha\right)\psi_R\right)\end{aligned}$$

and if the switch SW1 of the first auxiliary ring RL is again closed at $t=t_b$, the evolution over time from there on is left at:

[Equation 22]

$$\frac{2T_A}{\hbar}(t_C - t_b) = 2\alpha_0$$

and

[Equation 23]

$$\beta = \frac{\Delta V}{\hbar}(t - t_c)$$

will become the following.

[Equation 24]

$$\Psi(t) = \exp(-i\alpha_0)\left(\cos\left(\frac{\pi}{4} + \alpha_0\right)\psi_L + \sin\left(\frac{\pi}{4} + \alpha_0\right)\exp(-i\beta)\psi_R\right) \quad (24)$$

$\alpha_0$ and $\beta_0$ can be arbitrarily selected from 0 to $2\pi$, so equation (24) provides n arbitrary unitary transformations with respect to the one quantum bit that is a component of the quantum Turing machine. That is to say, FIG. 6 and FIG. 7 provide examples of one quantum bit that is a component for constituting a quantum Turing machine. The second auxiliary ring RR on the right side obviously works the same way.

Figure 8:
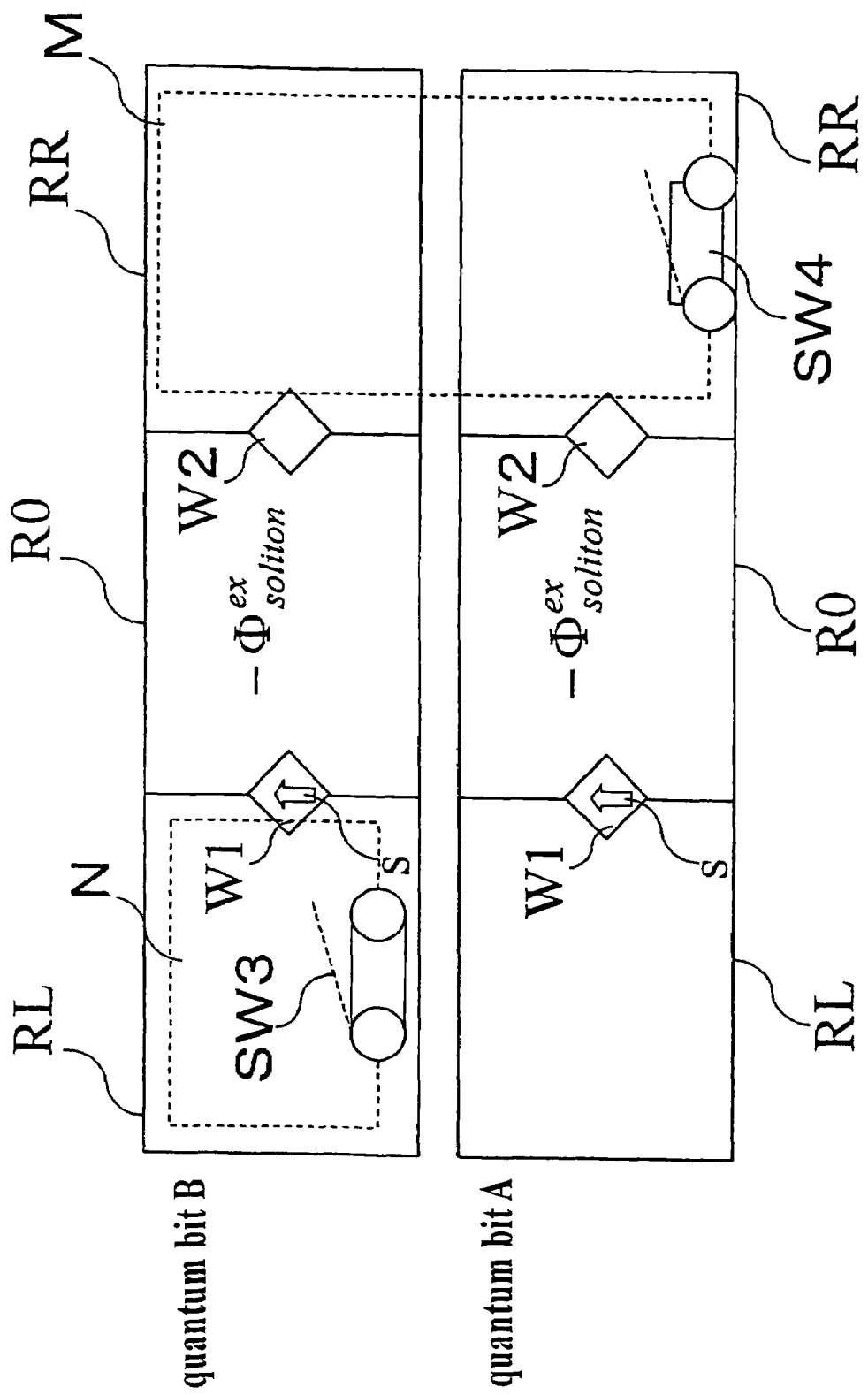
FIG. 8 is a diagram for explaining a mode that enables a control NOT gate using two quantum bits.
Figure 9:
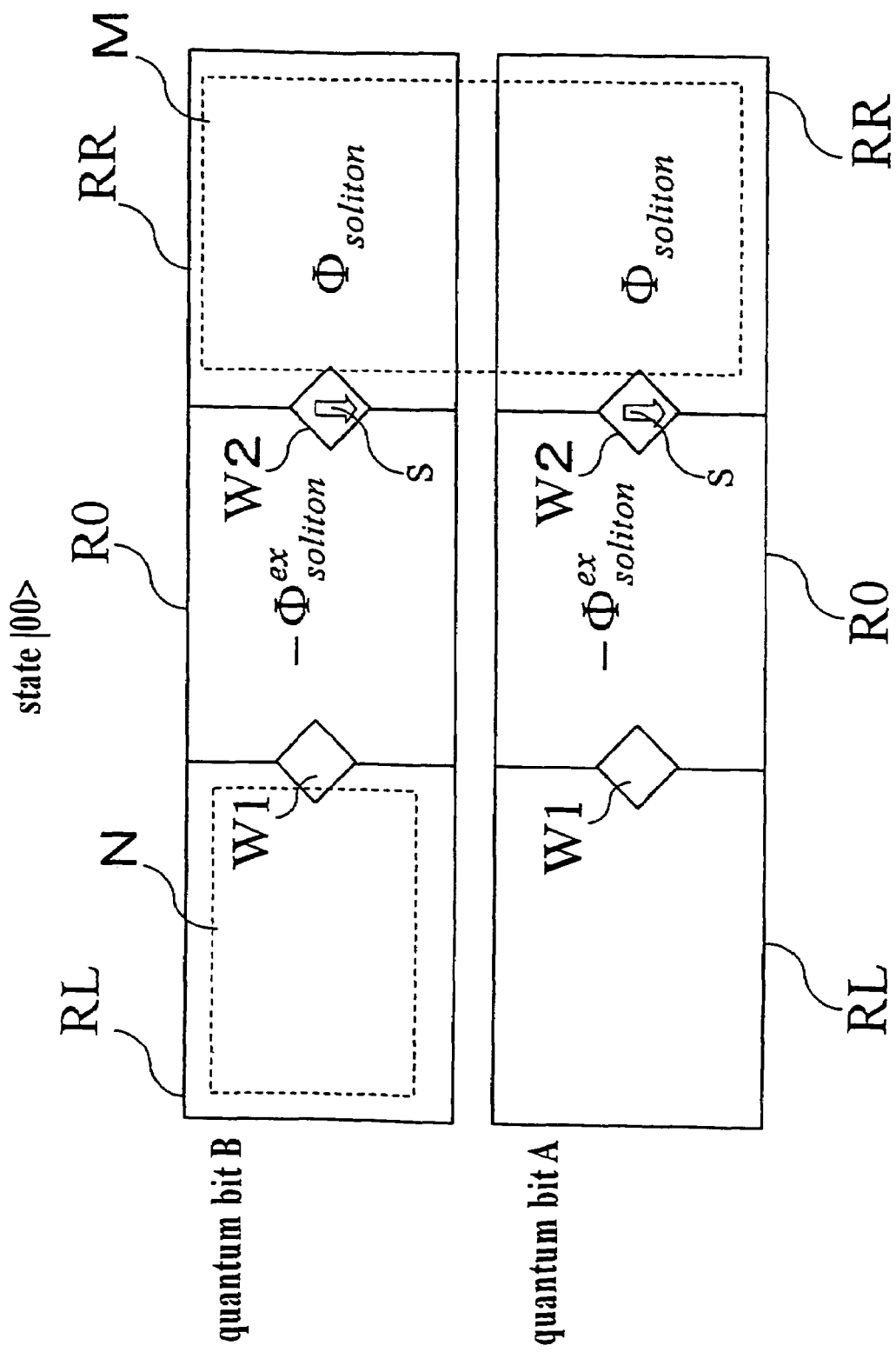
FIG. 9 is a diagram for explaining the functioning of a control NOT gate with two quantum bits.
Figure 10:
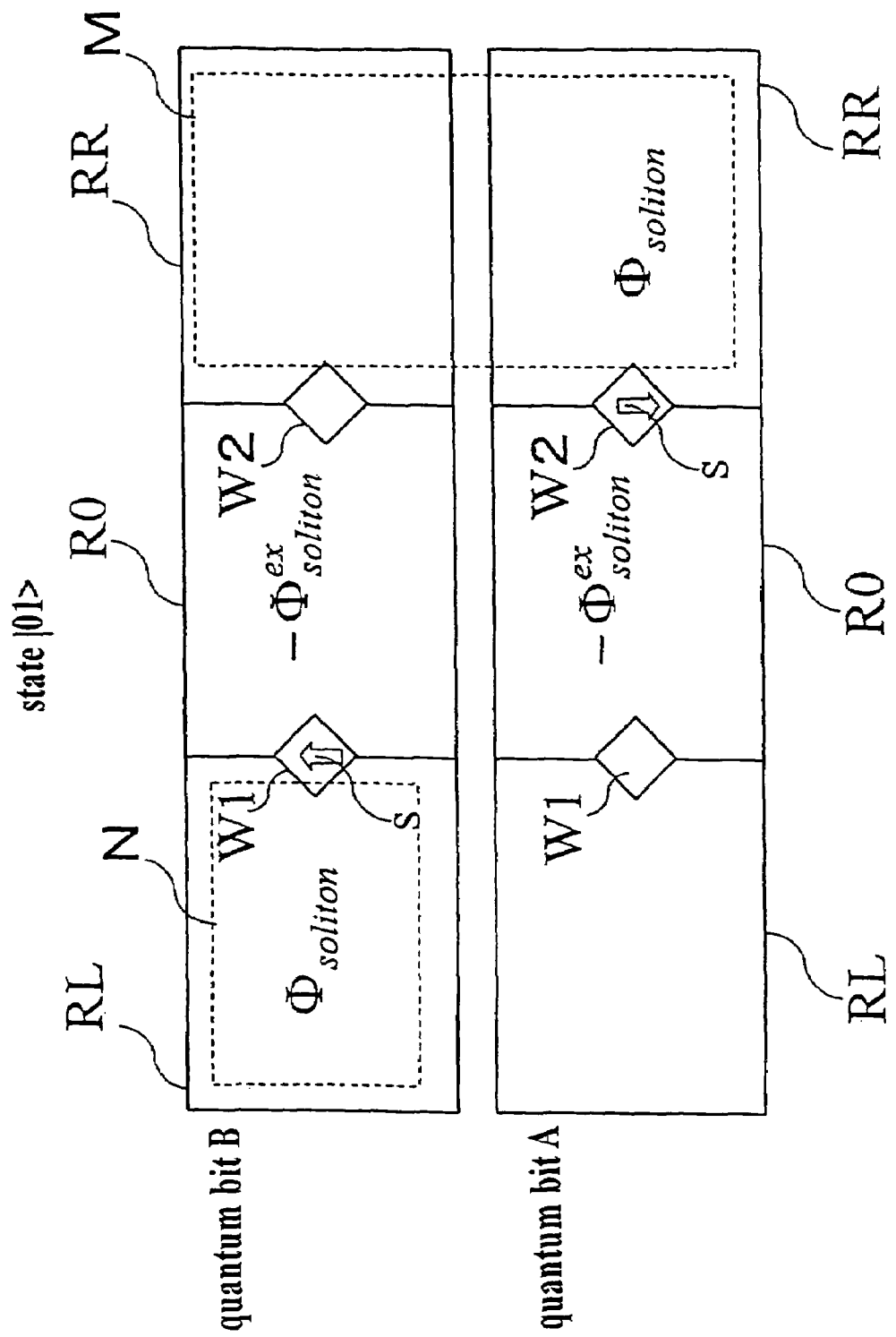
FIG. 10 is a diagram for explaining the functioning of a control NOT gate with two quantum bits.
Figure 11:
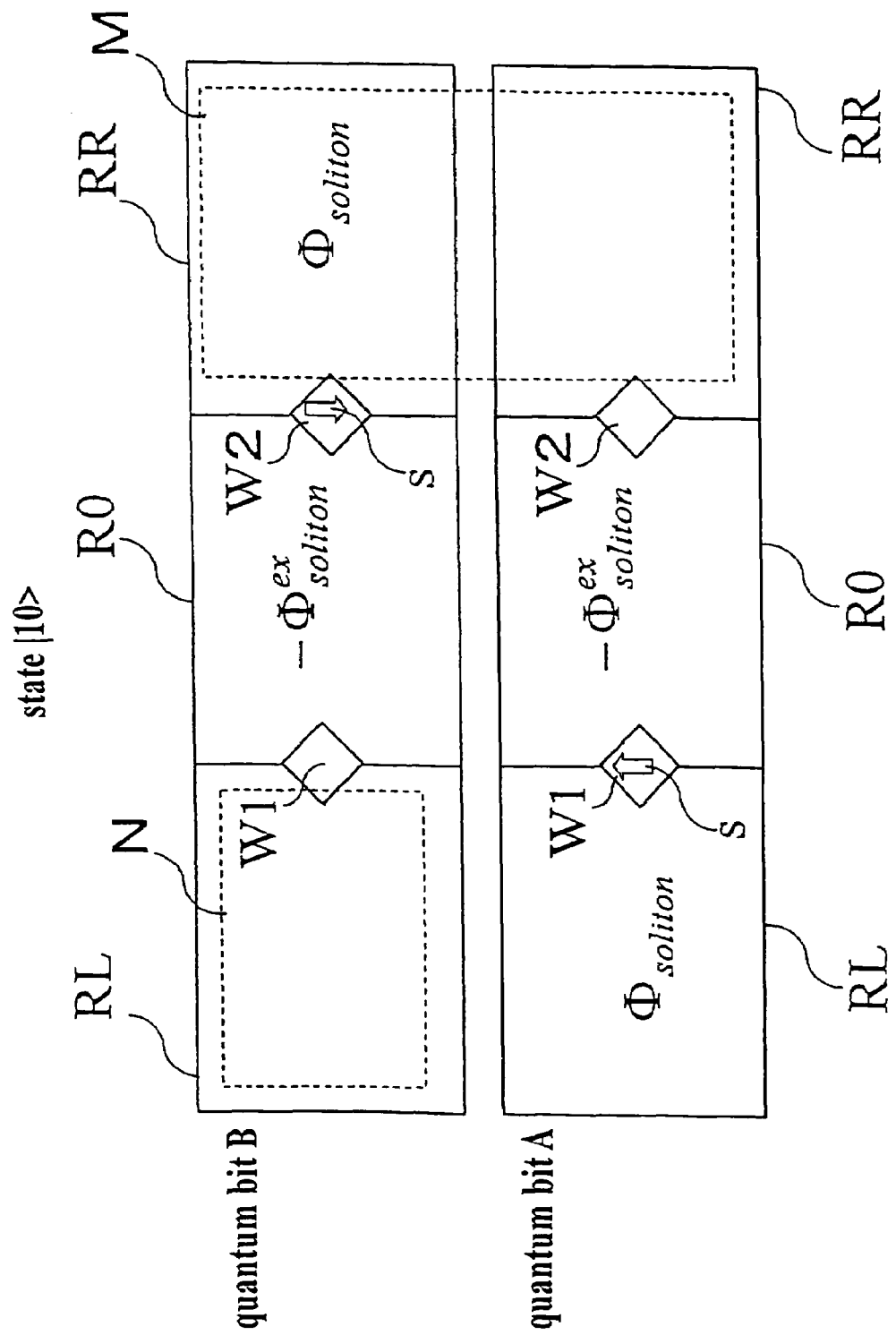
FIG. 11 is a diagram for explaining the functioning of a control NOT gate with two quantum bits.
Figure 12:
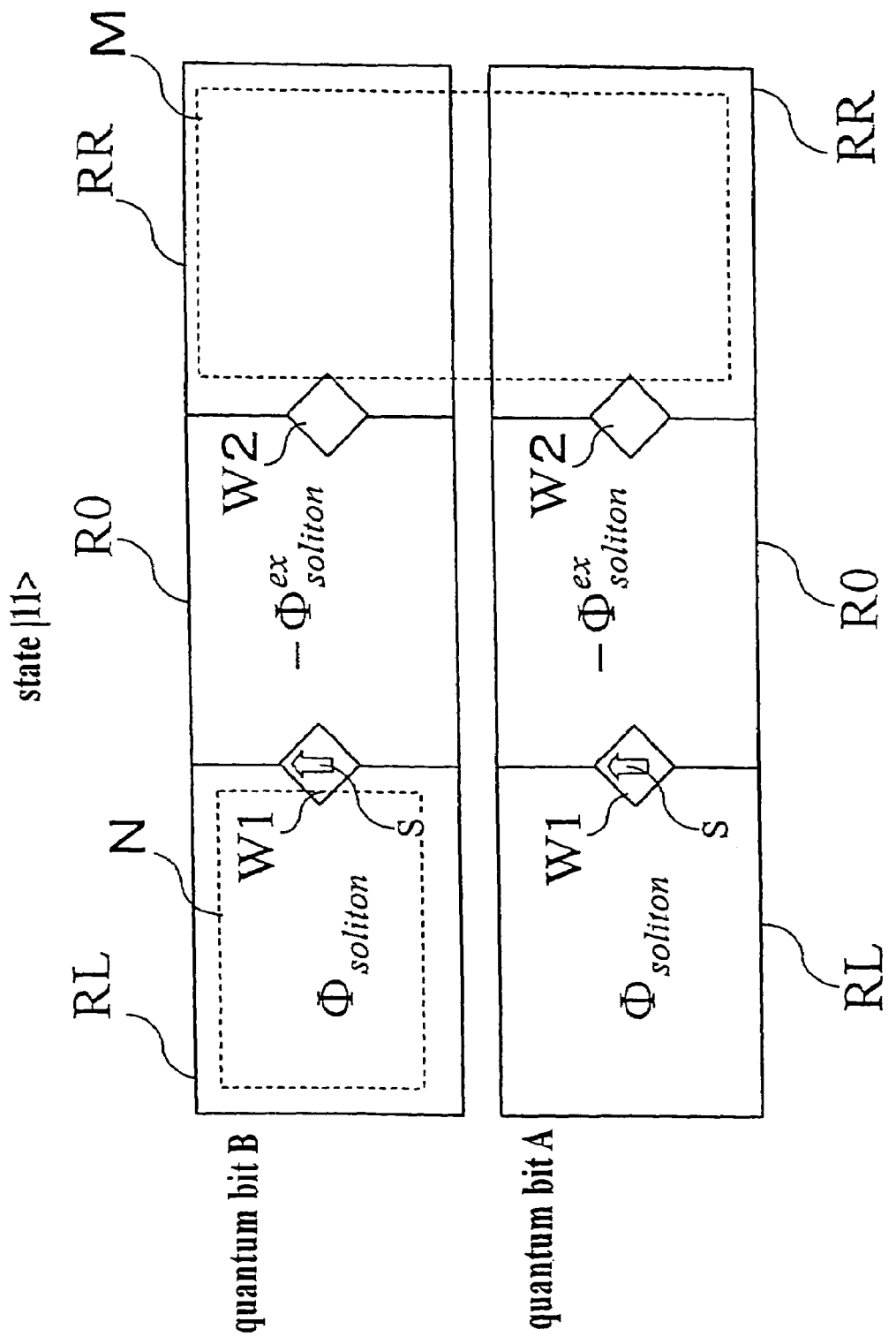
FIG. 12 is a diagram for explaining the functioning of a control NOT gate with two quantum bits.

Next, a method is described of fabricating a control NOT gate between two quantum bits that is required to create a quantum Turing machine. Taking the quantum bit explained with reference to FIG. 6 and FIG. 7 as quantum bit B, a quantum bit A having the same constitution as quantum bit B is added thereto. This is shown in FIG. 8. To make it easier to understand, only the electric line relating to the control NOT gate is left. Furthermore, to effect interaction between the quantum bits A, B, an interaction ring M, balance ring N were prepared.

That is, as shown in FIG. 8, a control NOT gate is constituted between two quantum bits by arranging the two quantum bits A, B in parallel lines, superimposing the balance ring N equipped with a switch SW3 on the first auxiliary ring RL of quantum bit B, and also superimposing the interaction ring M equipped with a switch SW4 across both the second auxiliary ring RR of quantum bit B and the second auxiliary ring RR of quantum bit A.

For simplicity, here, it is assumed that it has been designed so that the coefficient of self-induction of the interaction ring M and the coefficient of self-induction of the balance ring N are the same. This coefficient of self-induction is taken to be $\mu$ coupling. Also, it is assumed that after being electrically insulated, the first auxiliary ring RL of quantum bit B and the balance ring N are closely vertically superimposed so that only magnetic flux generated in the first auxiliary ring RL of quantum bit B is sensed.

The interaction ring M and the balance ring N are both taken to be constituted of single-order parameter superconductor, and that a superconducting current flows that cancels out all of the magnetic flux generated in the auxiliary rings RL, RR of quantum bits A, B. That is, the route taken by the magnetic flux is that it passes through the interior of the auxiliary ring RL of each of the quantum bits A, B, and inside the interaction ring M is repulsed, passing to the outside of the interaction ring M.

Then, the operation of the control NOT between the two quantum bits A, B is executed by, first, creating a soliton S in the ring R0 of each of the quantum bits A, B while applying in each ring R0 a magnetic field corresponding to the phase slip Θsoliton based on the phase difference soliton S, and then switching on the switch SW4 of the interaction ring M.

The state realized at this time is a in which the states cited in FIG. 9~FIG. 12 are superimposed. The switch SW3 of balance ring N and the switch SW4 of interaction ring M are taken to be closed, and are therefore omitted in FIG. 9~FIG. 12 (interaction is started by closing the switches).

Each of the states defined in FIG. 9~FIG. 12 are written as |00>, |01>, |10>, |11>. A Hamiltonian matrix drawn when each has gone from first component to fourth component would be as shown in the following equation (25).

[Equation 25]

$$\begin{bmatrix} 4\varepsilon & T_B & T_A & T_A T_B \\ T_B & 2\varepsilon & T_A T_B & T_A \\ T_A & T_A T_B & \varepsilon & T_B \\ T_A T_B & T_A & T_B & \varepsilon \end{bmatrix} \quad (25)$$

Here, for simplicity, the external field applied to auxiliary rings RL, RR is omitted. Also, regarding the auxiliary rings RL, RR of the quantum bits A, B as having the same coefficient of self-induction, energy produced by the ring-shaped superconducting current was subtracted beforehand as an offset. Also, the energy of the magnetic field based on the coefficient of mutual induction was also ignored for simplicity.

$T_A$ is the tunneling probability of the soliton S at quantum bit A, and $T_B$ is the tunneling probability of the soliton S at quantum bit B. Also,

[Equation 26]

$$\varepsilon = \frac{\Phi_{soliton}^2}{2\mu_{coupling}}$$

is the energy produced by the interaction ring M, balance ring N. If $\varepsilon$, which is further offset, is deducted from the above matrix equation (25), we get the following equation (27).

[Equation 27]

$$\begin{bmatrix} 3\varepsilon & T_B & T_A & T_A T_B \\ T_B & \varepsilon & T_A T_B & T_A \\ T_A & T_A T_B & 0 & T_B \\ T_A T_B & T_A & T_B & 0 \end{bmatrix} \quad (27)$$

Next, if $T_A \ll T_B$, the following equation (28) applies.

[Equation 28]

$$\begin{bmatrix} 3\varepsilon & T_B & 0 & 0 \\ T_B & \varepsilon & 0 & 0 \\ 0 & 0 & 0 & T_B \\ 0 & 0 & T_B & 0 \end{bmatrix}$$

Regarding $T_A \ll T_B$, prior to effecting interaction of the quantum bits A, B, the connections of the electric lines constituting quantum bits A, B can be changed and the lines modified, such as by making them longer. Also, as described below, the auxiliary rings can be used to modify the tunneling probability.

In addition, when $T_B \ll \varepsilon$, we get the following.

[Equation 29]

$$\begin{bmatrix} 3\varepsilon & 0 & 0 & 0 \\ 0 & \varepsilon & 0 & 0 \\ 0 & 0 & 0 & T_B \\ 0 & 0 & T_B & 0 \end{bmatrix}$$

The time-evolution of the system wave function $\Psi(t)$ is expressed by the following equation (30).

[Equation 30]

$$\Psi(t) = c_{00}\exp\left(-i\frac{3\varepsilon}{\hbar}t\right)|00\rangle + c_{01}\exp\left(-i\frac{\varepsilon}{\hbar}t\right)|01\rangle + \frac{c_{10+11}}{\sqrt{2}}(|10\rangle + |11\rangle)\exp\left(i\frac{T_B}{\hbar}t\right) + \frac{c_{10-11}}{\sqrt{2}}(|10\rangle - |11\rangle)\exp\left(-i\frac{T_B}{\hbar}t\right)$$

In the above equation (30),

[Equation 31]

$c_{00}, c_{01}, c_{10+11}, c_{10-11}$ is a complex number constant. Particularly when

[Equation 32]

$$\frac{2T_B}{\hbar}t = \pi$$

|10> is transformed to |11>, and |11> to |10>.

That is, at this time, the unitary transformation matrix with respect to wave function will be the following

[Equation 33]

$$\exp(-i\theta_0)\begin{bmatrix} \exp(-i\theta_i) & 0 & 0 & 0 \\ 0 & \exp(-i\theta_2) & 0 & 0 \\ 0 & 0 & 0 & 1 \\ 0 & 0 & 1 & 0 \end{bmatrix}$$

where, the phase term shown below is associated with this equation.

[Equation 34]

$\exp(-i\theta_0), \exp(-i\theta_1), \exp(-i\theta_2)$

This phase term can be made 1 by unitary transformation with respect to the above one quantum bit. Executing this unitary transformation makes it possible ultimately to realize the control NOT gate

[Equation 35]

$$\begin{bmatrix} 1 & 0 & 0 & 0 \\ 0 & 1 & 0 & 0 \\ 0 & 0 & 0 & 1 \\ 0 & 0 & 1 & 0 \end{bmatrix}$$

that is the object.

In the above, with respect to the setting of the tunneling probability to $T_A \ll T_B$, the connections of the electric lines constituting quantum bits A, B are changed and the lines modified, such as by making them longer, prior to effecting interaction of the quantum bits A, B, but the auxiliary rings can also be used to modify the tunneling probability. As shown in FIG. 13, for example, if auxiliary ring R10 is affixed and an external field applied therein, the potential barrier can be effectively changed, enabling the tunneling probability of the soliton S to be changed.

While the above examples have been described with reference to one or two of the quantum bits, multiple-bit implementation is possible by provision of an arbitrary number of the quantum bits.

A bit can be read by measuring the magnetic flux generated in the auxiliary rings RL, RR. After having once been read, the soliton S can be handled as a classical information bit by modifying the site energy of the soliton S to make it greater than the tunneling energy. That is, taking the localizing probability of the phase difference soliton S as either 0% or 100%, classical digital logic which a superimposed state isn't used in can be effective.

Figure 14:
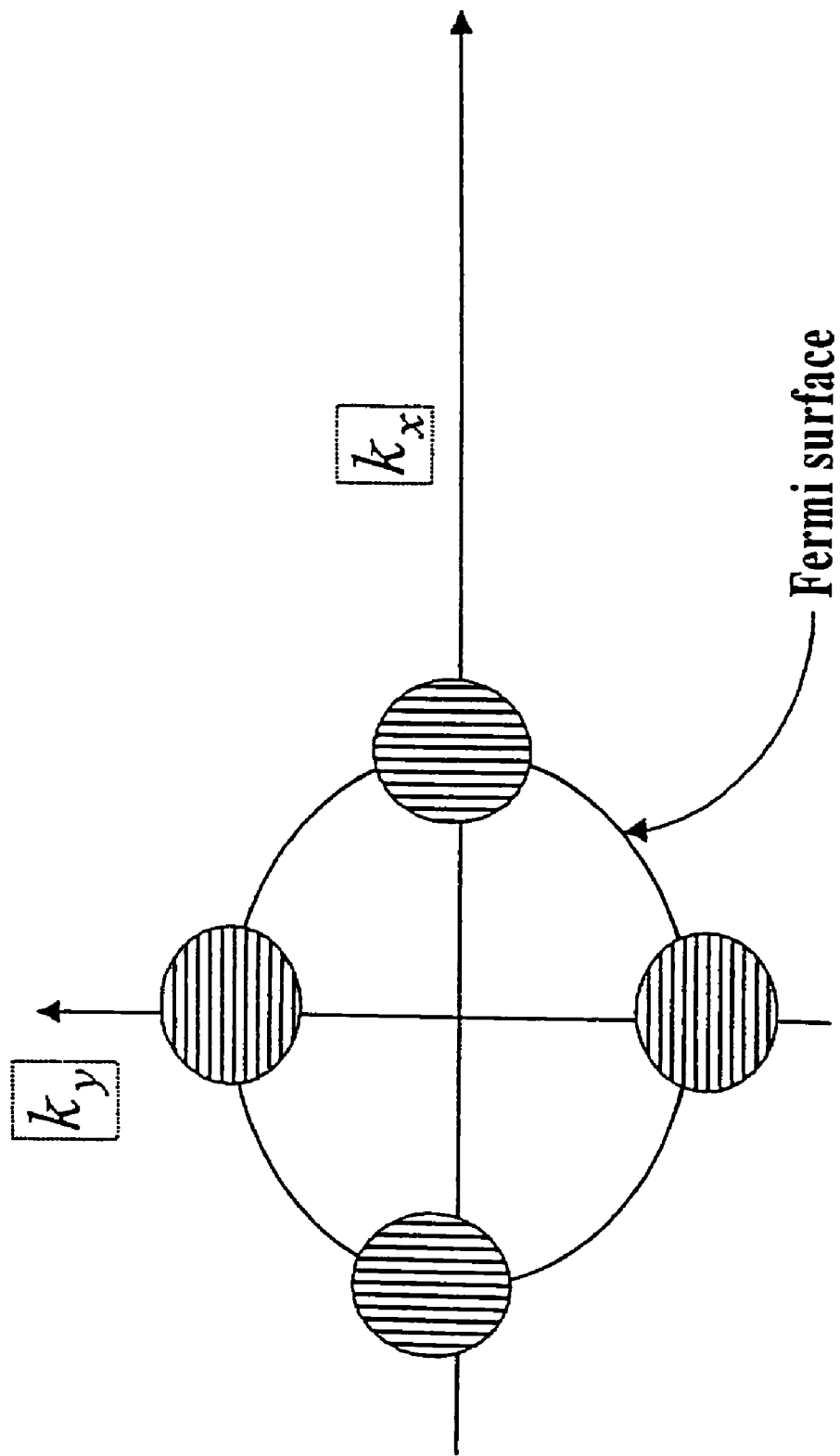
FIG. 14 is a diagram for explaining a mode in which plural order parameters apply, even with a single band.

Also, there are cases in which the multiple superconducting order parameters used in the present invention exist not only in multiple bands, but in the same band. For example, if a superconductor is a d-wave superconductor, as shown in FIG. 14, there are strong interactions inside the regions shown with vertical stripes and inside the regions shown with the horizontal stripes of the Fermi surface. If there are weak interactions between the vertical stripes and horizontal stripes of the Fermi surface, separate superconducting order parameters can be defined with each of the vertical-stripe and horizontal-stripe portions, making it possible to have soliton S exist in a superconductor having the same band. The configuration and effect disclosed by this invention can be achieved with this soliton S, too.

INDUSTRIAL APPLICABILITY

As described in the foregoing, with the quantum Turing machine of this invention, a soliton S can be localized in a superconductor having multiple superconducting order parameters by contriving the shape of a superconducting electric line.

Therefore, it becomes easy to manipulate bits, making it possible to facilitate quantum bit constitution. It is also possible to surely execute basic logical operation processing such as unitary transformation and control NOT operations. Also, multiple-bit and integration are possible. Furthermore, using the macroscopic quantum state that is a superconductor makes it easier to maintain coherence and can ensure sufficient time for executing a quantum algorithm.

The invention claimed is:

1. A Turing machine formed using a superconductor, constituted by a quantum bit created by utilizing a phase difference soliton created between plural types of superconducting electrons existing at each of multiple bands of the superconductor,
the quantum bit being constituted by localizing the phase difference soliton in a line circuit that includes:
a line circuit main body formed of the superconductor, and
well-shaped portions formed with a reduced line-width at at least two positions on the line circuit main body.

2. A Turing machine formed using formed using a superconductor, constituted by a quantum bit created by utilizing a phase difference soliton created between plural types of superconducting electrons existing at each of multiple bands of the superconductor,
the quantum bit being constituted by localizing the phase difference soliton in a ring that includes:
a ring main body formed of the superconductor, and
well-shaped portions formed with a reduced line-width at at least two positions on the ring main body.

3. The Turing machine described in claim 2, wherein the quantum bit is constituted by affixing a first auxiliary ring to a first of the well-shaped portions, and by affixing a second auxiliary ring to a second of the well-shaped portions, and by also providing a switch in each of the first auxiliary ring and the second auxiliary ring.

4. The Turing machine described in claim 3, wherein unitary transformation of the quantum bit is realized by localizing the phase difference soliton in the ring and operating each switch of the first auxiliary ring and the second auxiliary ring.

5. The Turing machine described in claim 4, wherein the unitary transformation of the quantum bit is performed by first, within the ring, creating the phase difference soliton in the ring by switching on the switch of that ring while applying a magnetic field corresponding to phase slip produced by the phase difference soliton, next, switching on the switch of an auxiliary ring selected from one of the first and second auxiliary rings, applying a magnetic flux as an external field inside the selected auxiliary ring, switching off the switch of the selected auxiliary ring, and switching the switch on again after a prescribed time has elapsed.

6. The Turing machine described in claim 5, wherein a control NOT gate is constituted between two of the quantum bits by arranging the above quantum bits in two parallel lines, superimposing a balance ring equipped with a switch on a first auxiliary ring of the quantum bit on one side, and also superimposing an interaction ring equipped with a switch across both a second auxiliary ring of the quantum bit on one side and a second auxiliary ring of the quantum bit on the other side.

7. The Turing machine described in claim 6, wherein operation of the control NOT between the above two quantum bits is executed by, first, creating a phase difference soliton within each ring of the two quantum bits by switching on the switch of that ring while applying a magnetic field corresponding to phase slip produced by a phase difference soliton, and after that, switching on the interaction ring switch.

8. The Turing machine described in any one of claims 1 to 7, including an arbitrary number of the quantum bits for multiple-bit implementation.

9. The Turing machine described in any one of claims 1 to 7, constituted by a quantum bit created by utilizing plural types of superconducting order parameters existing at a same band of the superconductor.

* * * * *